United States Patent [19]
Hantusch

[11] 4,286,374
[45] Sep. 1, 1981

[54] LARGE SCALE INTEGRATED CIRCUIT PRODUCTION

[75] Inventor: Gerald H. Hantusch, Cheadle, England

[73] Assignee: International Computers Limited, Stevenage, England

[21] Appl. No.: 120,649

[22] Filed: Feb. 11, 1980

[30] Foreign Application Priority Data

Feb. 24, 1979 [GB] United Kingdom ............... 06622/79

[51] Int. Cl.³ ............................................. H01L 21/90
[52] U.S. Cl. .......................................... 29/580; 29/591
[58] Field of Search .......................... 29/580, 590, 591; 357/68, 71

[56] References Cited

U.S. PATENT DOCUMENTS

| 3,781,975 | 1/1974 | Ressel et al. | 29/580 |
| 4,197,633 | 4/1980 | Lorenze et al. | 29/580 |

FOREIGN PATENT DOCUMENTS

2303798 8/1973 Fed. Rep. of Germany ............. 29/580

*Primary Examiner*—Donald L. Walton
*Attorney, Agent, or Firm*—Lee, Smith & Jager

[57] ABSTRACT

A method of forming connection networks for an integrated circuit device, by forming an orthogonal array of grooves in a substrate, with the grooves of one array deeper than those of the other array; and by providing conductive strips at the bottoms of the grooves and at selected regions of the groove side walls which strips serve to provide a desired pattern of interconnections.

10 Claims, 6 Drawing Figures

LARGE SCALE INTEGRATED CIRCUIT PRODUCTION

DESCRIPTION OF THE PRIOR ART

This invention relates to integrated circuit devices and the methods of producing such circuits.

It is well known to fabricate integrated circuit devices which include a single crystal substrate carrying a plurality of passive devices, such as resistors, capacitors etc., and/or active devices, such as diodes, triodes etc., and a network of metallic interconnections which provide conductive wires between the various devices mounted upon the substrate crystal.

These connection wires are usually formed by a multistep process including meatllising the entire surface of the substrate and then removing portions of the layer to leave the wiring by a process of photolithography.

In one such process the metallisation is produced by an evaporation technique, the metal layer is then covered by a thin layer of dielectric material, and at selected positions holes termed 'VIAS' are formed in the dielectric layer to expose the metal of the first layer. A second layer of metal is then evaporated over the whole surface, this second layer contacting the first layer by way of the 'VIAS.'

A further process of photolithography is then carried out upon the second layer of the metal to produce therefrom a second network of connections. This process can thus be regarded as a two layer metallisation. This two layer metallisation is anologous to the so-called "X-Y inter-connecting planes" as used in Multilayer Printed Circuit Technology in which the "VIAS" in the dielectric correspond to the "plated-through" holes of the above mentioned X-Y planes.

The known processes inherently involve problems which stem from the fact that the resolution of photolithography methods enable the use of metal tracks as narrow as $2\frac{1}{2}$ microns. However, the thickest dielectric layers in common use are no thicker than 1-2 microns. Because of this a significant amount of capacitive coupling is produced at locations at which a conductive track of the second metal layer crosses over a track of the first metal layer. This capacitive inter-coupling is in practice undesirable.

Amongst other disadvantages is that arising from the fact that metal evaporated through a "VIA" must be sufficiently thick to connect the surfaces of the first metal layer to the top surface of the above mentioned dielectric layer that is covered by the second metal layer.

Further difficulties arise in the formation of the "VIAS" since with the above mentioned two layer metallisation special techniques are necessary to shape and profile the walls of the VIA holes. When it is necessary to provide a large number of VIA holes or other such metallic through connections from the first to the second metal layer, it is found that it is very difficult to avoid manufacturing defects whereby, in practice, the possible or potential yield of microcircuits produced by the manufacturing process briefly outlined above is significantly reduced.

SUMMARIES OF THE INVENTION

According to an aspect of the present invention there is provided a method of forming a connection network for an integrated circuit device, including the steps of providing a substrate of crystalline material having a planar surface, forming in the substrate a first array of grooves of a first depth relative to the planar surface, forming in the substrate a second array of grooves of a second depth relative to the planar surface and such that the grooves of the arrays intersect, and providing conductive strips in the grooves of each said array together with additional conductive strips for selectively electrically interconnecting said conductive strips so that the latter are interconnected according to a desired pattern of interconnections.

Preferably, the grooves of the first array are orthogonal to those of the second array.

Conveniently, the grooves of the two arrays are formed in two principal stages in the first of which stages all of the grooves are formed to said first depth and in the second stage, grooves of one of the arrays are deepened so that the bases of these grooves lie in a common plane which is at said second depth.

Preferably the width of the grooves of the second array are wider than those of the first array.

In practice the top surface of the crystalline material which is normally a single crystal silicon is included in the 100 orientation of the crystal structure of the material, and the grooves have a truncated Vee cross-section produced by a selective etching process.

In carrying out the processes disclosed in this specification the etchants used can be those disclosed in an article entitled, "Dielectric Isolation Comprehensive, Current and Future" by K. E. Bean and W. R. Runyan, and published in the January 1977 issue of the Journal of the Electrochemical Society.

BRIEF DESCRIPTION OF DRAWINGS

Reference will now be made to the accompanying drawings in which.

DESCRIPTION OF THE PREFERRED EMBODIMENT AND METHODS OF PRODUCTION

In the following description only the principal stages involved will be specifically mentioned. Thus the various washing, cleaning, intermediate stages in a photolithography operation, will not, for the sake of brevity, be separately considered unless any such stage has an especial significance other than a conventional or standard purpose.

The first major phase of the process of the invention is the production of an orthogonal array of truncated Vee shaped grooves in a wafer 1 of silicon which has been cut from a crystal such that the plane of the wafer lies in the 100 orientation of the original crystal. The cutting of the silicon along the 100 orientation ensures that two orthogonally shaped crystal planes are aligned with the surface of the wafer. In practice, this arrangement of the preferred crystal planes enables the use of selective etchant which when utilised to etch along the plane produces Vee section grooves in the surface of the silicon. The angles between the walls of the grooves are determined by the physical properties of the silicon.

Figure 1:
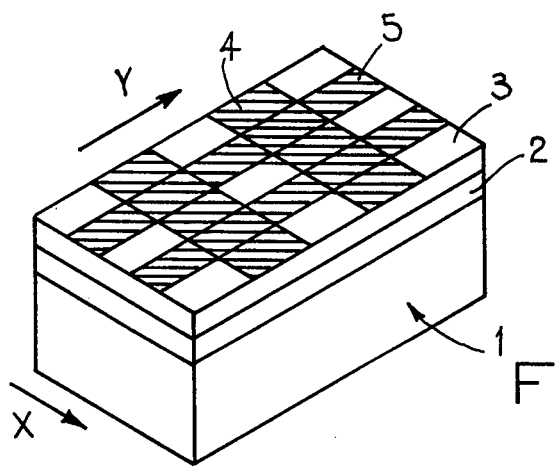
FIG. 1 illustrates a wafer of crystalline material following initial stages of a first photolithography process.
Figure 2:
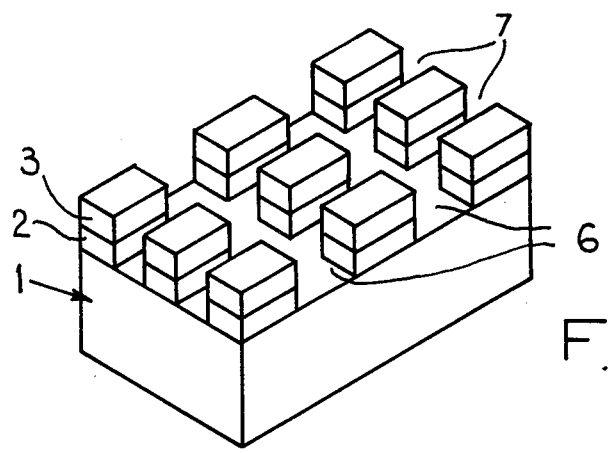
FIG. 2 illustrates the wafer of FIG. 1 at a later stage of the photolithography process.

Referring now to FIG. 1, this schematically shows a silicon wafer 1 having a top surface which lies in the 100 crystal orientation.

The surface of the wafer is coated with an etch resistant dielectric layer 2 in the form of a silicon dioxide or silicon nitride.

The oxide layer 2 is covered by a layer 3 of photoresist material. The conventional stages of a photolithography process are then carried out to form in the resist a pattern of orthogonally directed stripes 4, 5, which are conveniently respectively termed the X and Y direction stripes, and which are aligned with said orthogonal preferred axes of the silicon wafer. The stripes 4 are wider than the stripes 5. In practice, stripes 4 are twice the width of stripe 5.

The photo-resist defining the X and Y stripes 4, 5 is removed and the exposed oxide layer etched by an etchant such as hydroflouric acid to form therein a rectangular array of deeper strips or grooves 6, 7, at locations corresponding to the stripes and to expose the surface of the silicon. The remainder of the photo-resist is then removed.

The silicon wafer 1 with the grooved oxide layer 2 is then subjected to a selective etching process using an etchant such as mentioned in the above mentioned article. This operation produces truncated Vee shaped grooves 8, 9, in the surface of the silicon wafer 1. These grooves 8, 9 are of the same depth, but with the grooves 8 twice the width of grooves 9. Furthermore, it will be understood that control of the etching time determines the selected depth.

Figure 3:
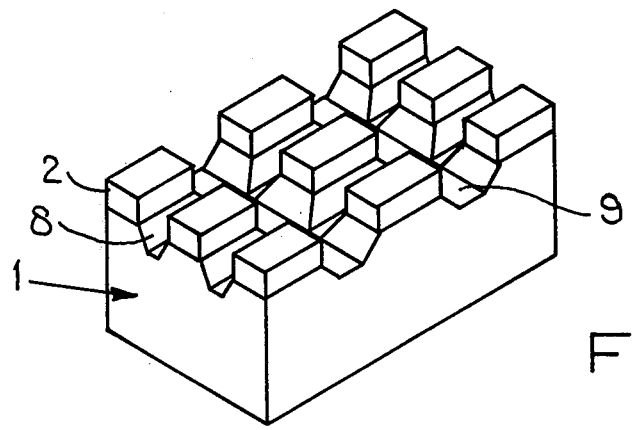
FIG. 3 illustrates the wafer at the end of the first photolithography process, the wafer having orthogonal grooves.

At this stage it will be understood that the surface of the wafer has been effectively divided by the intersect grooves 8,9 into an array of MESAS 10. It is convenient to regard this part of the process as representing the end of a first principal phase of the process, and is shown by the FIG. 3.

A second principal phase involves making the X direction grooves 8 deeper.

This second phase includes a secod photolithography process involving covering all of the exposed surfaces of the silicon wafer 1 with a layer of an etch resistant material such as silicon dioxide, applying a photoresist, forming a pattern of strips whose positions correspond to the originally provided broad X orientation stripes 4 removing the oxide at the portions of the X strips, etching the oxide to re-expose the silicon surface at places corresponding to the X grooves.

The thus etched wafer plus oxide layers is then subjected to a second selective etching process which is continued for a time period long enough for the X direction grooves 8 to be made deeper than the previously formed Y direction grooves. This depth is proportional to the original width of the stripes 4 as compared with the stripe 5. Thus the grooves 8 are made twice as deep as the grooves 9. As before, the time duration of the etching time is used to control depth of etching.

In practice, it is convenient to achieve this by controlling the selective etching process such that the widths of the bottoms of the X and Y grooves 8, 9 are the same.

After the selective etch, all of the remaining etch resistant oxide layer 2 applied to the silicon wafer 1 is removed thereby to expose the top surface of the wafer.

Figure 4:
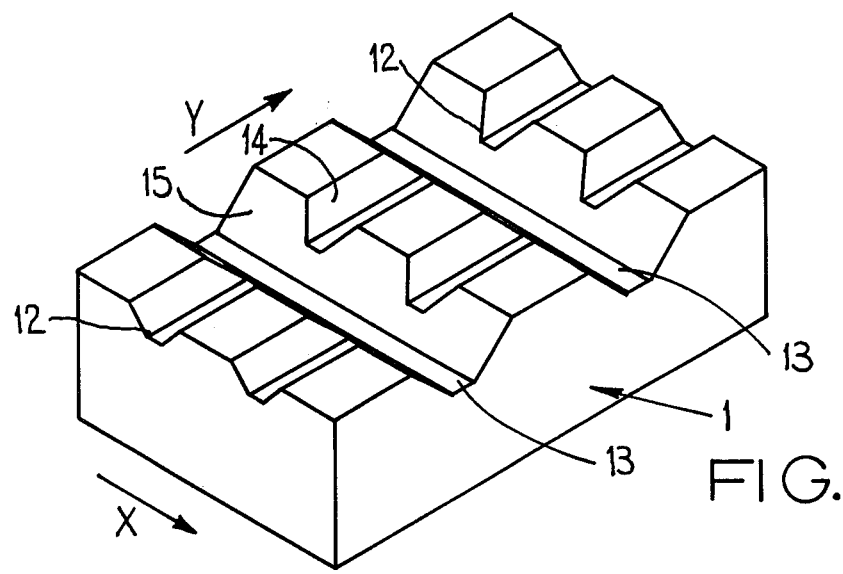
FIG. 4 illustrates the wafer of FIG. 3 following a second photolithography process which serves to deepen some of the grooves of the wafer of FIG. 3.

This condition represents the end of the second phase. At this stage the wafer will be as shown in FIG. 4. That is to say a wafer having on its top surface an orthogonal array of X and Y truncated Vee grooves 8,9, the Y direction grooves being shallower than the X direction grooves 8. Thus as can be seen from FIGS. 4 and 5, the latter figure being a section of the wafer of FIG. 4, the surface of the wafer has been divided into a facetted set of surfaces comprising three parallel planes (the first comprising the plane of the wafer top surface 11, a second comprising the common plane of the bases 12 of the shallower Y grooves 9 and a third comprising the common plane of the bases 13 of the X grooves 8), and intersecting sides 14, 15 of the grooves 8, 9 which connect with the various surfaces.

The principal phase next involved will be governed or set by a general consideration as to whether or not the facetted wafer 1 is to be associated with passive or active devices, or combinations of active or passive devices.

Figure 5:
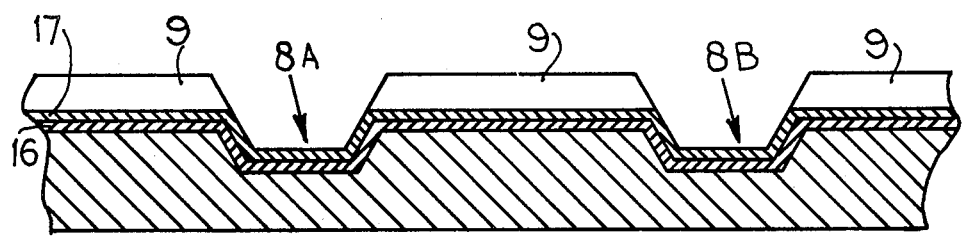
FIG. 5 is a sectional view illustrating a stage of the process used to form electrical interconnections between grooves and FIG. 6 illustrates a wafer of FIG. 4 following connection formation.

For the purposes of description it will be presumed that the active circuit elements are to be mounted upon the facetted wafer of FIGS. 4 and 5, and that in this particular case passive connectors interconnecting the various grooves, according to a desired configuration, are to be fabricated.

Thus in this case the third phase involves coating the entire surface with a layer 16 of an acid resistant dielectric material i.e. silicon dioxide or nitride which layer is for example, 1–2 microns thick, thereby covering the whole of the exposed silicon surface.

The thus coated surface is covered by a layer 17 of metal which is desirably 1 to 2 microns thick. This thickness can be produced by a layer of vacuum deposited metal subsequently thickened by a normal process of wet electro-plating. This layer is illustrated in the cross-section of FIG. 5.

A third photolithography stage is then carried out so as to produce from the metal layer the desired network of interconnections between metal strips left at the base of the X grooves 8 and the now sectioned Y grooves 9.

Thus this stage is intended to provide all of the desired X orientation wiring, all of the Y orientation wiring, and any inter-connections between the X and Y directions by way of the walls 14, 15.

Thus the third photolithography process involves using a mask which defines the material to be removed from the all over metal layer.

Figure 6:
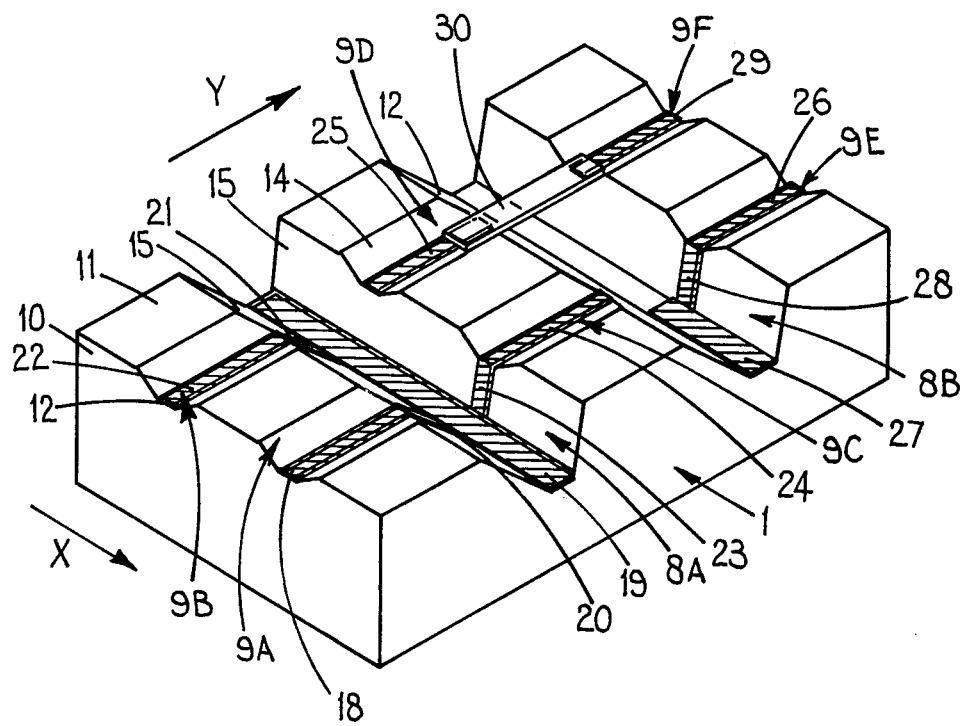

As will be understood this stage of the process involves a variety of connection forms and FIG. 6 schematically illustrates a number of the possible connection forms which will now be briefly discussed.

A first form of connection essentially comprises a connection between a metal strip 18 and a Y groove section 9A and a metal strip 19 extending lengthwise of an X groove 8A the connection comprising a link 20 joining the strips 18, 19. As will be seen this link lies against the associated sloping wall 15 between the section 9A and groove 8A.

In the Figure two more such connections are shown, the second being the strip 21 between the metal strip 22 of the shallow groove section 9B and the metal strip 19, and the strip 23 between the metal strip 24 of the shallow groove section 9C and the metal strip 19.

For convenience the connections between the strips 18 and 19, 22 and 19, and 24 and 19 can be regarded as T connections.

It will be noted that the strip 19 is not connected to the strip 25 of the Y groove section 9D.

A further formed connection is indicated between the metal strips 26 and 27 of the Y groove section 9E and groove 8B. In this connection the metal strip 26 of section 9E is coupled by way of a connection strip 28 to the metal strip 27, this form of connection is conveniently called an elbow joint.

It will be noted that the strips 24, 27 of the sections 9C and 9E are not connected, and that the strip 29 of the Y groove section 9F is not connected by way of an X groove metal strip to the section 9D.

In this particular case the section 9F and 9D are interconnected by a bridging connection 30. The formation of this bridging connection will now be considered.

Following the removal of the resist involved in the preparation of the connector network, the grooves 8 and 9 are filled in with a dielectric material. One such material can be a polymer such as that known as Kapton dispersed in a suitable solvent, and is applied to the metallised wafer construction by for example, a dip coating process.

This layer of dielectric effectively encapsulates all of the electrical wiring, or connections. Following this encapsulation stage the above mentioned "bridging" conductors are provided. These can be produced by forming troughs in the dielectric material by a fourth photolithographic process involving the use of a photoresist and subsequent etching stage, which troughs cut into the thick dielectric to expose a length of the side wall or walls of the end region of a groove section to one side of an Y groove and a corresponding length of the immediately opposite Y groove section and the ends of metal in such grooves.

With this arrangement it will be apparent that the metal sections 9D and 9F can be effectively joined end to end without involving any electrical contact with metal in an X groove. These bridging connections between any part of the connector network can be formed by utilising the photoresist layer used to form said troughs as follows:

After etching into the dielectric and without touching the photoresist a second layer of metal is deposited over the entire surface area of the wafer assembly as so far produced by, for example, an evaporation technique.

If necessary this layer of metal can be thickened by a plating technique.

The layer of metal will then be partially removed so as to leave bridge connections at those places at which such connections may be desired, because photo-resist under the metal which is not required is "floated away" by a conventional technique together with the metal deposited thereupon.

At the completion of this stage of the process the only metal remaining of the second metal layer is that forming the bridging connections between those Y groove sections which it was desired to interconnect.

These bridging connections preferably have a width approximately equal to the metal in the Y groove with which they are associated.

The exposed second metal surfaces if any, can be readily covered by a further all-over layer of dielectric (not shown).

In the above discussed process it will be noted that the required connections are produced by means of four different photolithographic masks only. The mask used for the purpose of forming the troughs in the dielectric is also used to shape the bridging layers of the second metal.

Thus it will be seen that the deep layer of dielectric 30 filling the X grooves does not have to be cut entirely through to provide 'vias'—the 'T-junctions' and 'elbows' are used instead.

From the above it will be noted that at the completion of the third phase the original surface of the silicon wafer has been retained in the form of a plurality of rectangular MESAS and the grooves between the MESAS are used to accommodate the network or connecting lines.

With this arrangement it is possible to mount separate silicon chips at the MESA surfaces and to provide bonding (not shown) at suitable locations, i.e. on those MESAS not used as a support for the additional silicon/chips. Wire bonds can be conveniently provided between those pads and the pads or the like on the added silicon wafers or chips.

In such a circumstance, the silicon wafer which has been processed to provide the connection network can serve as a fully metallised substrate.

Bonding pads and connections between these and the X and Y layers are conveniently first defined in the fourth or "trough" mask, and a fifth mask is used to cut holes in the last layer of dielectric to expose bonding pads where required.

I claim:

1. A method of forming a connection network for an integrated circuit device, including the steps of providing a substrate of crystalline material having a planar surface, forming in the substrate a first array of grooves of a first depth relative to the planar surface, forming in the substrate a second array of grooves of a second depth relative to the planar surface and such that the grooves of the arrays intersect, and providing conductive strips in the grooves of each said array together with additional conductive strips for selectively electrically interconnecting said conductive strips so that the latter are interconnected according to a desired pattern of interconnections.

2. A method as claimed in claim 1, in which the substrate comprises silicon and said planar surface is included in the 100 orientation of the crystal structure of the material.

3. A method as claimed in claim 1 or 2, wherein said first and second arrays are produced by a selective etching process.

4. A method as claimed in claim 1 or 2 wherein the grooves of the first and second arrays are formed in two principal stages, in the first of which all of the grooves are formed to said first depth; and in the second stage, the grooves of one of the arrays are deepened so that the bases of these grooves are at a common distance from the planar surface.

5. A method as claimed in claim 4, wherein the grooves of said one of the arrays are so formed as to be wider than those of the other one of the arrays.

6. A method as claimed in any one of the claims 1 or 2 wherein the grooves of the first array are orthoganal to those of the second array.

7. A method as claimed in any one of claims 1 or 2 wherein the grooves of the arrays are so formed as to have a truncated Vee section.

8. A method as claimed in any one of claims 1 or 2 wherein first conduction strips are provided along selected position of the bases of the grooves of each array and further conductive strips are provided to interconnect said first conductive strips to provide the desired circuit pattern.

9. A method as claimed in claim 8, in which the first and second conduction strips are formed by initially covering the whole of the exposed surface of the substrate following formation of the arrays of grooves, with a conductive material and then removing all of that part of said layer that does not contribute to said first and second conductive strips.

10. A method as claimed in claim 8 and including providing at least one further conductive strip which connects the bases of two adjacent portions of a groove of the first array of grooves, and bridges the adjacent grooves of the second array of grooves, by filling in at least the neighbouring portions of the adjacent grooves and then providing a bridging conductive strip extending across the filled-in portion to connect electrically with conductive strips of the relevant first array grooves.

* * * * *